(12) United States Patent
Kim et al.

(10) Patent No.: US 10,211,084 B2
(45) Date of Patent: Feb. 19, 2019

(54) CHUCK TABLE AND SUBSTRATE PROCESSING SYSTEM INCLUDING THE SAME

(71) Applicant: Samsung Electronics Co., Ltd., Suwon-si, Gyeonggi-do (KR)

(72) Inventors: Doojin Kim, Asan-si (KR); Youngsik Kim, Cheonan-si (KR); Kunho Song, Asan-si (KR); Yongdae Ha, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 162 days.

(21) Appl. No.: 15/215,578

(22) Filed: Jul. 20, 2016

(65) Prior Publication Data

US 2017/0040202 A1 Feb. 9, 2017

(30) Foreign Application Priority Data

Aug. 3, 2015 (KR) .................. 10-2015-0109517

(51) Int. Cl.

| | |
|---|---|
| *B24B 27/00* | (2006.01) |
| *H01L 21/683* | (2006.01) |
| *B24B 37/10* | (2012.01) |
| *B24B 37/30* | (2012.01) |
| *B24B 37/34* | (2012.01) |
| *H01L 21/687* | (2006.01) |
| *B25B 11/00* | (2006.01) |

(52) U.S. Cl.
CPC ...... *H01L 21/6838* (2013.01); *B24B 27/0061* (2013.01); *B24B 37/10* (2013.01); *B24B 37/30* (2013.01); *B24B 37/345* (2013.01); *H01L 21/68785* (2013.01); *B25B 11/005* (2013.01)

(58) Field of Classification Search
CPC ..... B24B 27/0061; B24B 37/10; B24B 37/30; B24B 37/345; B25B 11/005; H01L 21/6838; H01L 21/68785
See application file for complete search history.

(56) References Cited

U.S. PATENT DOCUMENTS

| | | | |
|---|---|---|---|
| 4,597,228 A * | 7/1986 | Koyama | ............... B24B 7/228 451/289 |
| 5,374,021 A | 12/1994 | Kleinman | |
| 5,951,376 A * | 9/1999 | Mandler | ............. B24B 13/0031 451/178 |
| 6,250,990 B1 | 6/2001 | Yoshii et al. | |
| 6,513,796 B2 | 2/2003 | Leidy et al. | |
| 6,746,022 B2 | 6/2004 | Cheung et al. | |
| 7,019,956 B2 | 3/2006 | Fujii et al. | |

(Continued)

FOREIGN PATENT DOCUMENTS

| | | |
|---|---|---|
| JP | 4311600 B2 | 5/2009 |
| JP | 5507654 B2 | 3/2014 |

(Continued)

*Primary Examiner* — Timothy V Eley
(74) *Attorney, Agent, or Firm* — Renaissance IP Law Group LLP

(57) ABSTRACT

A chuck table is provided and a substrate processing system including the same. The chuck table includes a base disk having a first vacuum hole, and a chuck disk disposed on the first vacuum hole. The chuck disk includes a plurality of first sectors and a first connection member connecting the first sectors to each other.

20 Claims, 12 Drawing Sheets

(56) References Cited

U.S. PATENT DOCUMENTS

| | | | |
|---|---|---|---|
| 7,654,887 B2 * | 2/2010 | Ishikawa | B24B 37/30 451/388 |
| 7,981,770 B2 | 7/2011 | Kaneko | |
| 8,597,448 B2 | 12/2013 | Hart et al. | |
| 8,705,008 B2 | 4/2014 | Shibazaki | |
| 8,753,923 B2 * | 6/2014 | Kobayashi | H01L 21/78 438/113 |
| 8,976,336 B2 | 3/2015 | Nayfeh et al. | |
| 9,347,988 B2 * | 5/2016 | Akiyama | G01R 31/2886 |
| 9,431,284 B2 * | 8/2016 | Muffler | B44C 1/227 |
| 9,583,376 B2 * | 2/2017 | Kumamoto | H01L 21/6838 |
| 2002/0117792 A1 * | 8/2002 | Leidy | B25B 11/005 269/21 |
| 2002/0139473 A1 | 10/2002 | Fujii et al. | |
| 2003/0116152 A1 | 6/2003 | Cheung et al. | |
| 2007/0063453 A1 * | 3/2007 | Ishikawa | B24B 37/30 279/3 |
| 2007/0177125 A1 | 8/2007 | Shibazaki | |
| 2007/0293128 A1 * | 12/2007 | Schafer | B24B 13/0037 451/7 |
| 2009/0011572 A1 | 1/2009 | Kaneko | |
| 2010/0267219 A1 * | 10/2010 | Kajiyama | B23K 26/0057 438/462 |
| 2011/0155299 A1 | 6/2011 | Hart et al. | |
| 2013/0026720 A1 | 1/2013 | Hori et al. | |
| 2013/0183811 A1 * | 7/2013 | Kobayashi | H01L 21/78 438/463 |
| 2013/0306215 A1 | 11/2013 | Toida | |
| 2014/0039661 A1 | 2/2014 | Lu et al. | |
| 2014/0071582 A1 | 3/2014 | Anada et al. | |
| 2014/0233009 A1 | 8/2014 | Nayfeh et al. | |
| 2016/0064230 A1 * | 3/2016 | Nishihara | H01L 21/304 451/41 |

FOREIGN PATENT DOCUMENTS

| | | |
|---|---|---|
| KR | 20120120165 A | 11/2012 |
| KR | 1348649 B1 | 1/2014 |

\* cited by examiner

CHUCK TABLE AND SUBSTRATE PROCESSING SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2015-0109517, filed on Aug. 3, 2015, in the Korean Intellectual Property Office. The entire contents of Korean Patent Application No. 10-2015-0109517 are hereby incorporated by reference.

TECHNICAL FIELD

The present disclosure relates to a substrate processing system. The present disclosure also relates to a chuck table used to fasten a substrate for processing.

BACKGROUND

There is an increasing demand for portable electronic devices such as mobile phones with limited thickness and that are relatively dense. A back-lap and/or back-grinding process may be performed to reduce a thickness of a semiconductor device, which is one of main components of a portable electronic device. For example, the back-lap process may include a step of grinding or polishing a back surface of a wafer such as those not provided with any pattern. A final thickness of a wafer is typically determined primarily based on the type of semiconductor device or based on the needs of a particular customer.

SUMMARY

Exemplary embodiments of the inventive concept provide a chuck table, which is configured to allow it to be partially repaired, and a substrate processing system including the same. The modular design allows for easy replacement and a significant reduction in costs when a repair is needed. Other exemplary embodiments of the inventive concept provide a chuck table, which can be repaired with high productivity, and a substrate processing system including the same.

According to exemplary embodiments of the inventive concept, a chuck table may include a base disk having a first vacuum hole, and a chuck disk disposed on the first vacuum hole. The chuck disk may include a plurality of first sectors and a first connection member connecting the first sectors to each other.

According to exemplary embodiments of the inventive concept, a substrate processing system may include an index stage, chuck tables disposed on the index stage to fasten a substrate, and a polishing module disposed on the chuck tables and used to polish the substrate. Each of the chuck tables may include a base disk having a vacuum hole and a chuck disk disposed on the vacuum hole. The chuck disk may include a plurality of first sectors and a first connection member connecting the first sectors to each other.

According to exemplary embodiments of the inventive concept, a chuck table may include a ceramic disk with a base recess and a vacuum hole, which is connected to a bottom of the base recess, and a chuck disk disposed in the base recess. The chuck disk may include porous ceramic sectors disposed on the vacuum hole and a first ceramic adhesive material connecting the porous ceramic sectors to each other and fastening the ceramic sectors to the base recess.

BRIEF DESCRIPTION OF THE DRAWINGS

The written disclosure herein describes illustrative embodiments that are non-limiting and non-exhaustive. Reference is made to certain of such illustrative embodiments that are depicted in the figures, as listed below.

Figure 1:
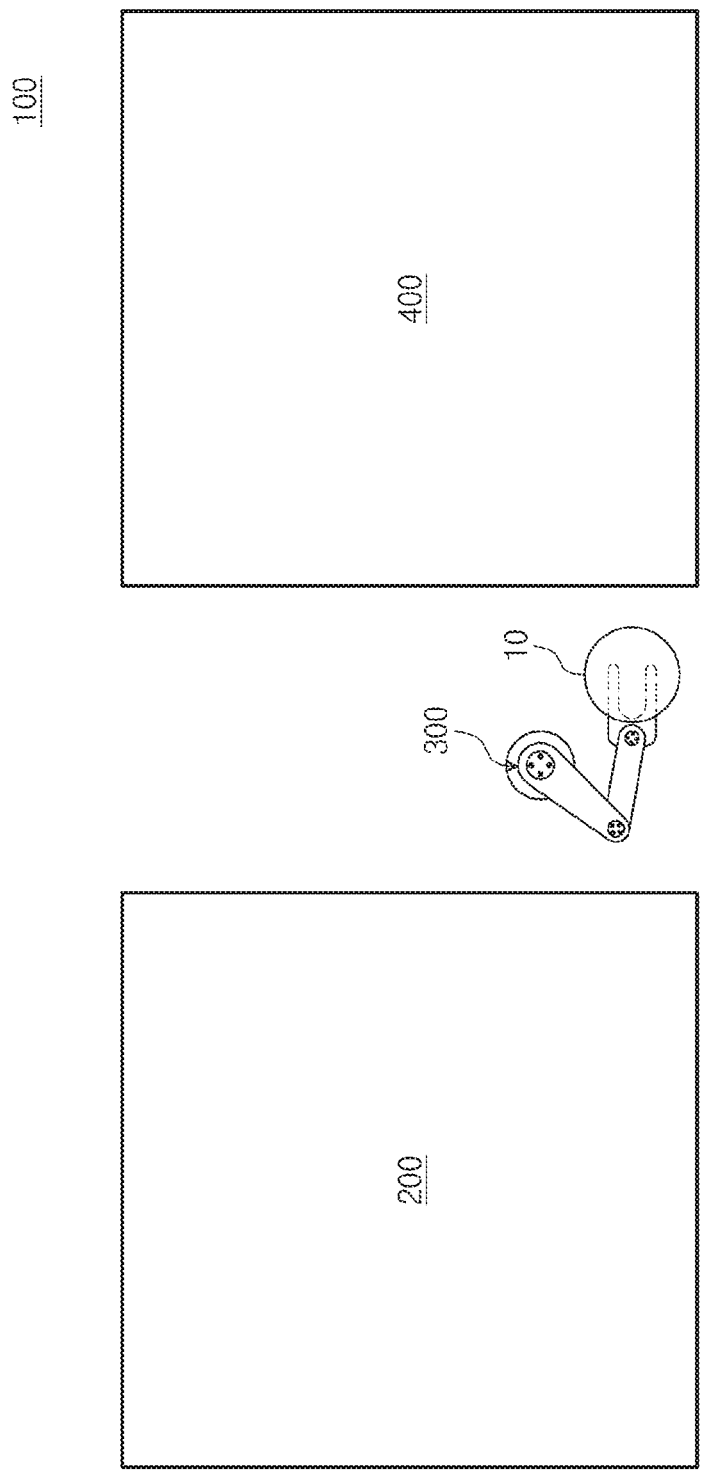
FIG. 1 is a schematic diagram exemplarily illustrating a semiconductor fabrication system according to exemplary embodiments of the inventive concept.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of components may be reduced or exaggerated for clarity. The use of similar or identical reference numbers in the various drawings is intended to indicate the presence of a similar or identical element or feature.

DETAILED DESCRIPTION OF THE PREFERRED EMBODIMENTS

Exemplary embodiments of the inventive concepts will now be described more fully with reference to the accompanying drawings, in which exemplary embodiments are shown. Exemplary embodiments of the inventive concepts may, however, be embodied in many different forms and should not be construed as being limited to the embodiments set forth herein; rather, these embodiments are provided so that this disclosure will be thorough and complete, and will fully convey the concept of exemplary embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", and so forth may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or relationship of a feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which exemplary embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic diagram exemplarily illustrating a semiconductor fabrication system 100, according to exemplary embodiments of the inventive concept. Referring to FIG. 1, the semiconductor fabrication system 100 may include a substrate processing system 200, a delivery system 300, and a package system 400. The substrate processing system 200 may be configured to perform one of several fabrication processes for fabricating a semiconductor device, on a substrate 10. The substrate 10 may include, for example, a wafer. The substrate processing system 200 may include a back-lap system. The back-lap system may be configured to perform a grinding and/or polishing process on a back surface of the substrate 10. The grinding and/or polishing process may make it possible to reduce a thickness of the substrate 10. In certain embodiments, the substrate processing system 200 may include a sawing system. The delivery system 300 may be disposed between the substrate processing system 200 and the package system 400. The delivery system 300 may be configured to allow the substrate 10 to be moved between the substrate processing system 200 and the package system 400. For example, the delivery system 300 may include a robot arm or a conveyer. The package system 400 may be a wafer-level package system. The package system 400 may include a soldering apparatus. The package system 400 may form solder bumps (not shown) on a wafer.

Figure 2:
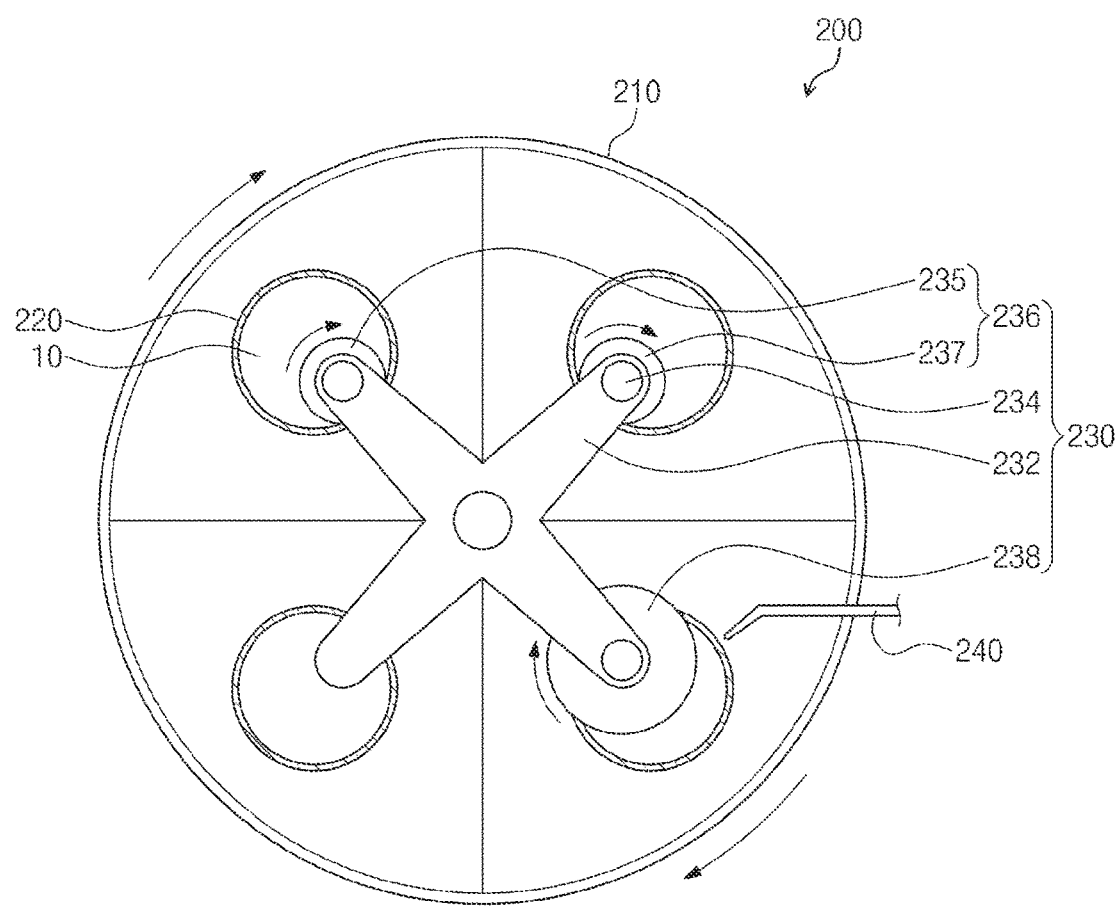
FIGS. 2 and 3 are plan and perspective views illustrating a substrate processing system of FIG. 1.
Figure 3:
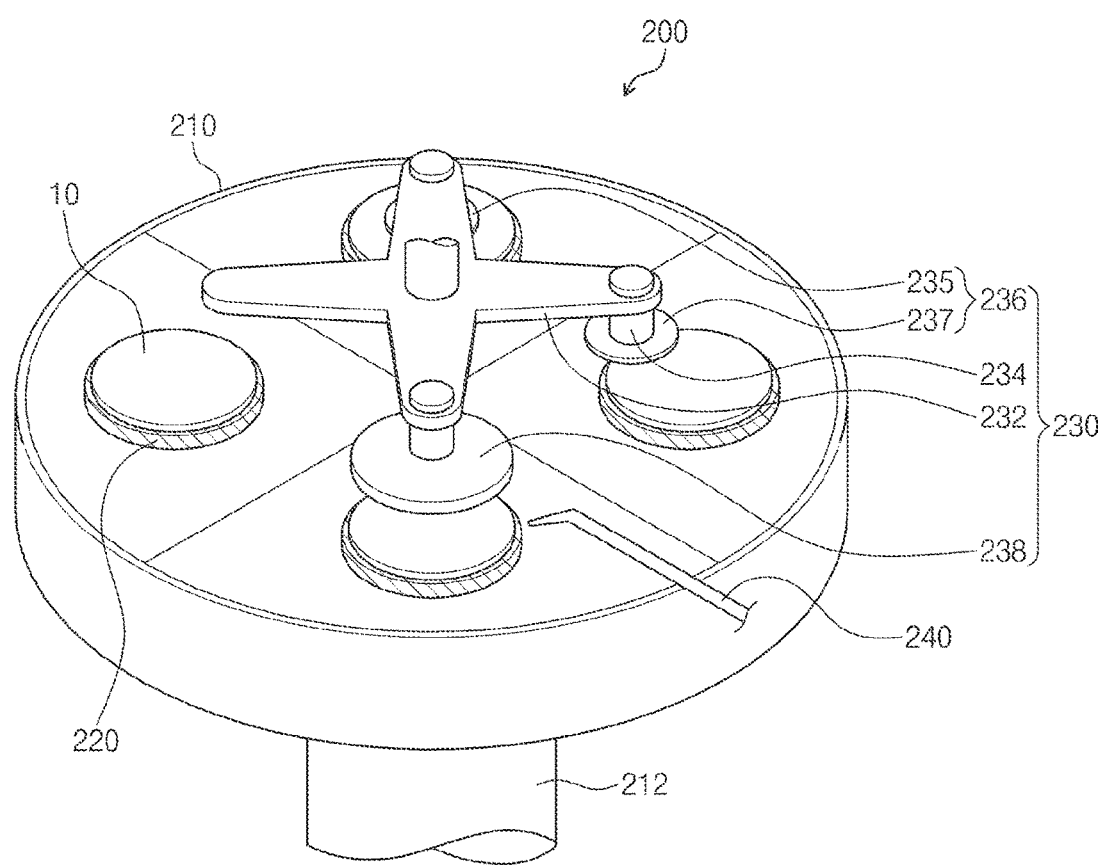

FIGS. 2 and 3 are plan and perspective views illustrating an example of the substrate processing system 200 of FIG. 1. Referring to FIGS. 2 and 3, the substrate processing system 200 may include an index stage 210, a plurality of chuck tables 220, a polishing module 230, and a slurry supplying nozzle 240. The index stage 210 may be configured to change positions of the chuck tables 220. Each of the chuck tables 220 may be configured to allow the substrate 10 to be loaded thereon. The polishing module 230 may be configured to perform a grinding and/or polishing process on the substrates 10. The slurry supplying nozzle 240 may supply slurry on the substrates 10. While FIGS. 2 and 3 show four chuck tables, other embodiments permit additional chuck tables for smaller or larger numbers of sequential stages in the processing.

In some embodiments, the index stage 210 may have a circular shape. The index stage 210 may have other shapes in other embodiments like a quadrilateral shape such as a square. The chuck tables 220 may be provided spaced apart from a center of the index stage 210. A shaft 212 may be used to rotate the index stage 210. The grinding and/or polishing process may be sequentially performed on the substrates 10 by the polishing module 230. For example, every time the grinding and/or polishing process on the substrate 10 is finished, the index stage 210 may rotate the chuck tables 220. Four chuck tables 220 may be disposed on the index stage 210. If the index stage 210 is rotated by 360°, the back-lap process on the substrates 10 may be finished.

The chuck tables 220 may be configured to fasten the substrate 10. For example, in the chuck tables 220, a vacuum pressure may be used to fasten the substrate 10. The chuck tables 220 may have substantially the same shape as the substrate 10. For example, each of the chuck tables 220 may have a circular shape. Each of the chuck tables 220 may be smaller than the index stage 210 and larger than each of the substrates 10. Some technical features associated with the chuck tables 220 are described below again with reference to some examples.

The polishing module 230 may be disposed on the index stage 210. In some embodiments, the polishing module 230 may include a branch head 232, spindles 234, grinding wheels 236, and a polishing pad 238.

The spindles 234 may be connected to the branch head 232. For example, four spindles 234 may be connected to the branch head 232. The branch head 232 may include portions extending in a direction from a center toward an edge of the index stage 210. The branch head 232 may have an 'X'-shaped structure. In some embodiments, the branch head 232 may include four branches at right angle, and the spindles 234 may be connected to the four branches, respectively, of the branch head 232. The spindle 234 may be connected to the grinding wheel 236 and the polishing pad 238. The branch head 232 may be configured to vertically move or elevate the grinding wheels 236 and the polishing pad 238 relative to the substrates 10. Vertical movement of the grinding wheels 236 and the polishing pad 238 permits sequential processing of the substrates 10.

The spindles 234 may be provided at ends of the branches of the branch head 232. The grinding wheels 236 and the polishing pad 238 may be disposed below the spindles 234. The spindles 234 may transfer a rotation power to the grinding wheels 236 and the polishing pad 238. For example, the grinding wheels 236 and the polishing pad 238 may be rotated at an angular speed of about 100 rpm to about 3000 rpm.

The grinding wheel 236 may be used to grind the substrate 10. In certain embodiments, the grinding wheels 236 may grind the chuck tables 220. Each of the grinding wheels 236 may include, for example, a diamond blade. The grinding wheels 236 may be used to reduce a thickness of the substrate 10. In some embodiments, the grinding wheels 236 may include a rough grinding wheel 235 and a fine grinding wheel 237. The rough grinding wheel 235 may be used to roughly grind the substrate 10. The fine grinding wheel 237 may be used to finely grind the substrate 10. For example, the substrate 10 may be ground to have flatness (or surface roughness) ranging from about 50 μm to about 200 μm.

The polishing pad 238 may be used to polish the substrate 10. The polishing pad 238 may have a diameter that is larger than that of the grinding wheel 236 and is substantially equal to that of the chuck table 220. The polishing pad 238 may include any suitable materials for polishing. For example, polishing pad 238 may contain at least one of nonwoven fabrics and stone dust. The substrate 10 may be polished to have flatness (or surface roughness) ranging from about 8 μm to about 12 μm. In certain embodiments, the chuck tables 220 may be polished by the polishing pad 238. For example, the polishing of the chuck tables 220 may occur periodically. Every time the top surfaces of the chuck tables 220 are damaged, the chuck tables 220 may be polished by the polishing pad 238.

The slurry supplying nozzle 240 may supply slurry into a space between the polishing pad 238 and the substrate 10. Alternatively, the slurry supplying nozzle 240 may be used to supply cooling water and/or cleaning solution in the space between the grinding wheels 236 and the substrates 10.

Figure 4:
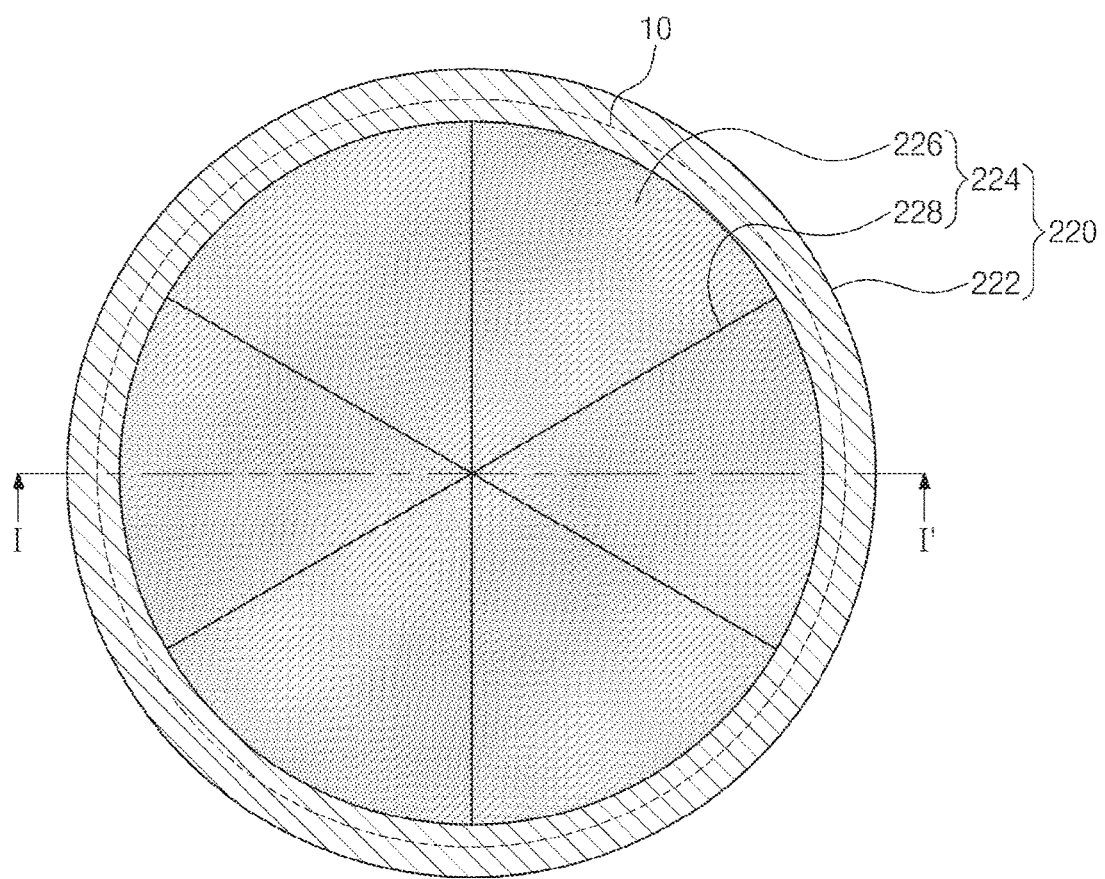
FIG. 4 is a plan view illustrating an example of a chuck table of FIGS. 2 and 3.
Figure 5:
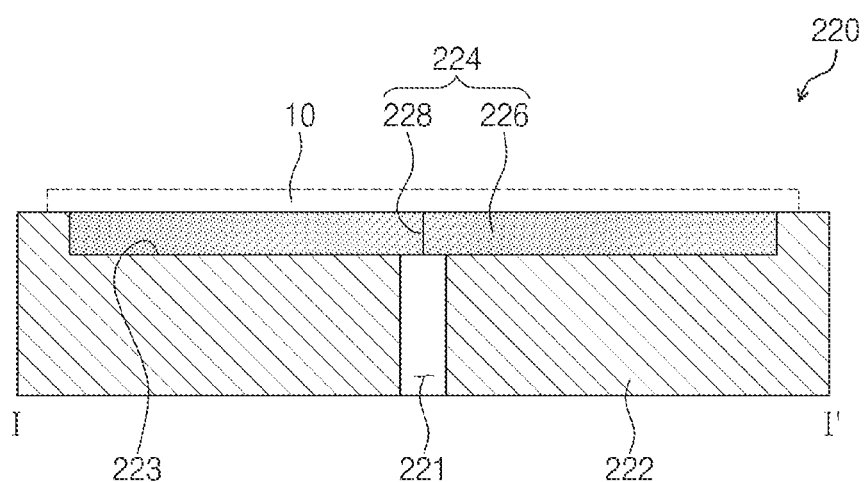
FIG. 5 is a sectional view taken along line I-I' of FIG. 4.

FIG. 4 is a plan view illustrating an example of the chuck table 220 of FIGS. 2 and 3. FIG. 5 is a sectional view taken along line I-I' of FIG. 4. Referring to FIGS. 4 and 5, the chuck table 220 may include a base disk 222 and a chuck disk 224. The base disk 222 may be disposed below the chuck disk 224. The chuck disk 224 may be used to fasten the substrate 10.

The base disk 222 may be provided to have an area larger than the chuck disk 224 and the substrate 10. For example, a diameter of the base disk 222 may be greater than that of the chuck disk 224. The base disk 222 may be formed of or include at least one of a ceramic material and a metallic material. The base disk 222 may have a thickness ranging from about 5 cm to about 10 cm. In some embodiments, the base disk 222 may be provided to have a base vacuum hole 221 and a base recess 223. The base vacuum hole 221 may be located at a center of the base disk 222. In certain embodiments, the base vacuum hole 221 may be located at an edge region of the base disk 222. The base vacuum hole 221 may be formed to be overlapped with the base recess 223, when viewed in a top view. The chuck disk 224 may be disposed in the base recess 223. The base vacuum hole 221 may be used as an air-flow pathway, allowing the substrate 10 to be fastened to the chuck disk 224 using a vacuum pressure. The chuck disk 224 may have substantially the same diameter as the base recess 223. The base recess 223 may be used to fasten the chuck disk 224. The base recess 223 may have a depth that is substantially equal to the thickness of the chuck disk 224. In other words, the top surfaces of the base disk 222 and the chuck disk 224 may be positioned at the same level or may be coplanar with each other.

The chuck disk 224 may be fastened to the base disk 222. The chuck disk 224 may be smaller than the substrate 10. For example, a diameter of the chuck disk 224 may be smaller than that of the substrate 10. In certain embodiments, the chuck disk 224 and the substrate 10 may have substantially the same area. For example, the chuck disk 224 may have a thickness ranging from about 5 mm to about 1 cm. In some embodiments, the chuck disk 224 may include a plurality of chuck sectors 226 and a chuck connection member 228. A center of a circle enclosing the chuck sectors 226 may be aligned with the base vacuum hole 221. The chuck connection member 228 may be used to connect the chuck sectors 226 to each other.

In some embodiments, the chuck sectors 226 may be formed of or include a porous ceramic material. The chuck disk 224 may be configured to include two or more chuck sectors 226. For example, the number of the chuck sectors 226 may be six. The chuck sectors 226 may be the same in terms of shape and size. The chuck sectors 226 may have a thickness ranging about 5 mm to about 1 cm. The chuck sectors 226 may have other shapes when the structures around the sectors 226 are shaped appropriately. For example, chuck sectors 226 may have a shape that is triangular.

The chuck sector 226 may be partially damaged by sliding of the substrate 10. The substrate 10 may lead to damage to at least one of the chuck sectors 226, during a loading or unloading operation. For example, the chuck sectors 226 may be damaged by a falling tool during a preventive maintenance operation. According to exemplary embodiments of the inventive concept, the chuck sectors 226 may be individually replaced with a new or repaired one. The replaced chuck sector 226 may be grinded or polished by the grinding wheels 236 and the polishing pad 238. The chuck sector 226 may be polished to have flatness of about 8 μm to about 12 μm. Cost for the individual replacement of the chuck sectors 226 may be less than the cost required to replace all the chuck sectors 226 of the chuck table 220. Accordingly, it is possible to increase productivity of the chuck sectors 226.

The chuck connection member 228 may be provided between the chuck sectors 226. In certain embodiments, the chuck connection member 228 may be provided between the chuck sectors 226 and the base disk 222. The chuck connection member 228 may be used to fasten the chuck sectors 226 to the base recess 223 of the base disk 222. In some embodiments, the chuck connection member 228 may be formed of or include a ceramic adhesive material. The chuck connection member 228 may be melted by applying heat energy thereto, when separation of the chuck sectors 226 is required. In certain circumstances, the chuck connection member 228 may be broken. For example, an object may impact the chuck connection member 228 and apply sufficient force to break the chuck connection member 228. When chuck connection member 228 becomes broken, the chuck connection member 228 may be removed using solvent and may then be replaced. In some circumstances, the chuck connection member 228 may be re-used to assemble the chuck sectors 226 after replacing one of the chuck sectors 226.

Figure 6:
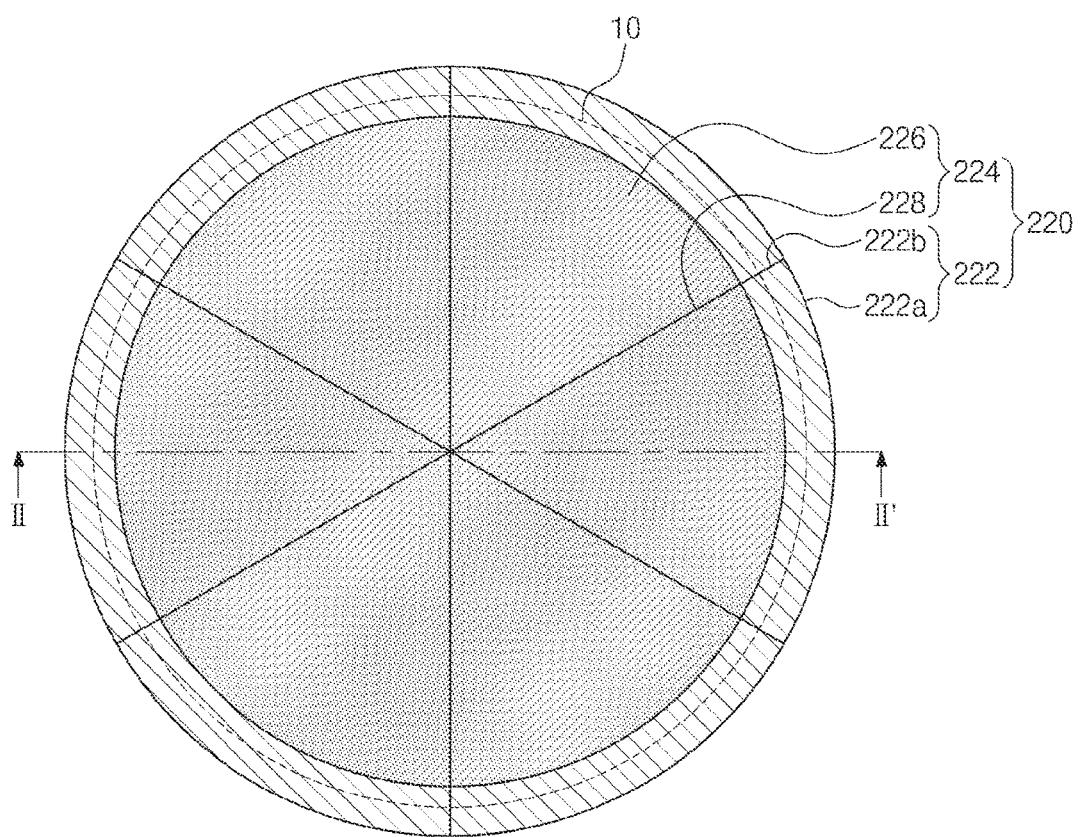
FIG. 6 is a plan view illustrating an example of the chuck table of FIG. 1.
Figure 7:
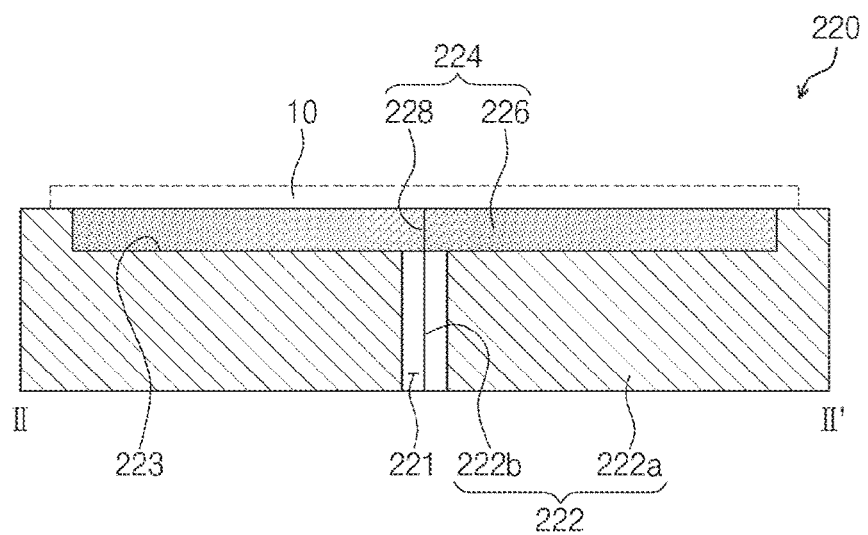
FIG. 7 is a sectional view taken along line II-II' of FIG. 6.

FIG. 6 is a plan view illustrating an example of the chuck table 220 of FIG. 1. FIG. 7 is a sectional view taken along line II-II' of FIG. 6. Referring to FIGS. 6 and 7, the base disk 222 of the chuck table 220 may include base sectors 222a and a base connection member 222b. The chuck disk 224 may be configured to have substantially the same features as that described with reference to FIGS. 4 and 5.

The base sectors 222a may be provided below the chuck sectors 226 of the chuck disk 224. In some embodiments, the base sectors 222a may be aligned to the chuck disk 224. The base disk 222 may be configured to include two or more base sectors 222a. For example, the number of the base sectors 222a may be six. The base sectors 222a may be the same in terms of shape and size. The base sectors 222a may be formed of or include a ceramic material.

The base sectors 222a may be vulnerable to an external impact. For example, when an external impact occurs to a corner of the base sector 222a adjacent to the base recess 223, the base sectors 222a may be easily broken. When one of the base sectors 222a is broken, it may be individually replaced with a new or repaired one. Cost for the individual replacement of the base sectors 222a may be less in cost than the amount required to replace all the base sectors 222a of the chuck table 220.

The base connection member 222b may be disposed between the base sectors 222a. The base connection member 222b may be used to connect the base sectors 222a to each other. The base connection member 222b may also be used to connect the base sectors 222a to the chuck sectors 226. In certain embodiments, the chuck connection member 228 may be used to connect the base sectors 222a to the chuck sectors 226. The base connection member 222b may be provided to expose an inner wall of the base vacuum hole 221. In some embodiments, the base connection member 222b may be formed of or include a ceramic adhesive material. The base connection member 222b may have different properties from the chuck connection member 228. For example, if the base connection member 222b is formed of a thermoplastic resin, the chuck connection member 228 may be formed of or include a thermosetting resin. The chuck connection member 228 may be used to fasten the chuck sectors 226 when at least one of the base sectors 222a is replaced. As another example, if the base connection member 222b is formed of a thermosetting resin, the chuck connection member 228 may be formed of or include a thermoplastic resin. As an additional example, the base connection member 222b may have a low chemical resistant property and/or a low corrosion resistant property to solvent, whereas the chuck connection member 228 may have a high chemical resistant property and/or a high corrosion resistant property.

Figure 8:
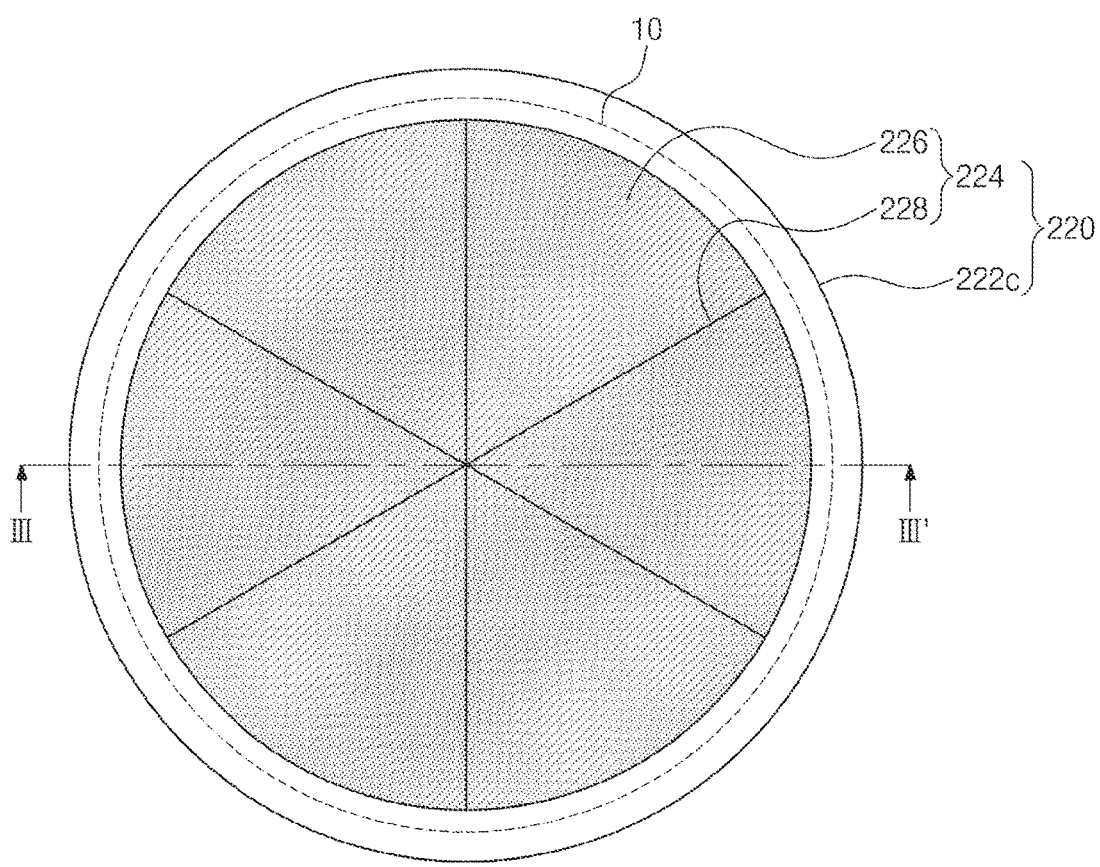
FIG. 8 is a plan view illustrating an example of the chuck table of FIG. 1.
Figure 9:
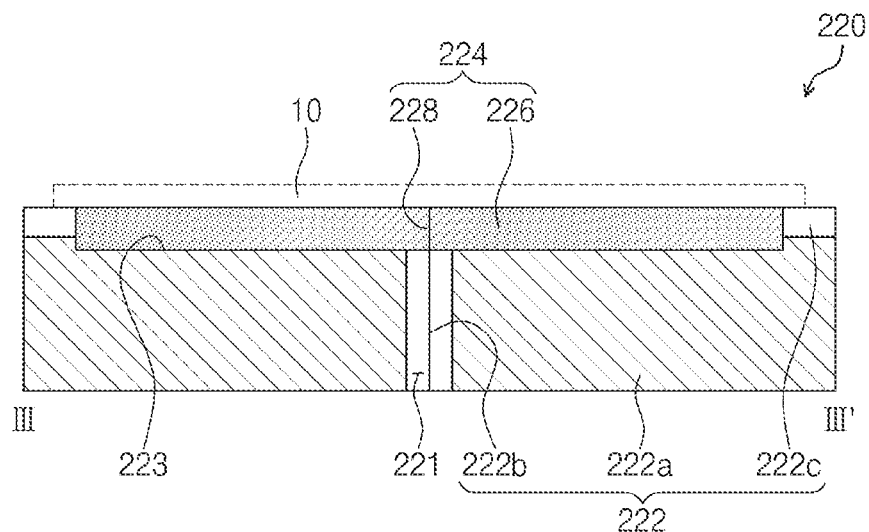
FIG. 9 is a sectional view taken along line III-III' of FIG. 8.

FIG. 8 is a plan view illustrating an example of the chuck table 220 shown in FIG. 1. FIG. 9 is a sectional view taken along line III-III' of FIG. 8. Referring to FIGS. 8 and 9, the base disk 222 may include a guard ring 222c provided on edge regions of the base sectors 222a. The chuck disk 224 may be configured to have substantially the same features as that described with reference to FIGS. 4 and 5.

The guard ring 222c may be configured to protect top surfaces of the edge regions of the chuck sectors 226. The guard ring 222c may be provided to enclose sidewalls of the chuck sectors 226. In some embodiments, the guard ring 222c may be formed of or include a ceramic material. The chuck sectors 226 may be provided in the guard ring 222c and the base recess 223. The base connection member 222b may be provided between the edge regions of the base sectors 222a and the guard ring 222c. The guard ring 222c may be fastened to the edge regions of the base sectors 222a. The guard ring 222c may prevent the base sectors 222a from being broken by an external impact or collision.

Figure 10:
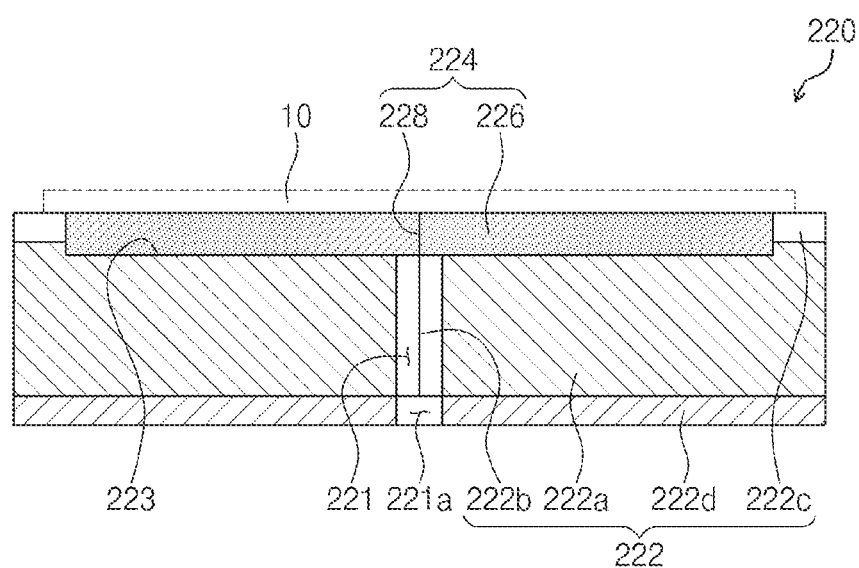
FIG. 10 is a sectional view illustrating an example of a base disk of FIG. 9.

FIG. 10 is a sectional view illustrating an example of the base disk 222 of FIGS. 8 and 9. Referring to FIG. 10, the base disk 222 may include a bottom disk 222d provided below the base sectors 222a. The chuck disk 224 may be configured to have substantially the same features as that described with reference to FIGS. 4 and 5.

The bottom disk 222d may be provided to have a bottom vacuum hole 221a. The bottom disk 222d may be disposed in such a way that the bottom vacuum hole 221a is aligned to the base vacuum hole 221. The bottom disk 222d may be formed of or include a ceramic material. A diameter of the bottom disk 222d may be equal to a distance between outer edges of two opposite pair of base sectors 222a. The bottom disk 222d may prevent the base sectors 222a from being broken by an external impact or collision.

Figure 11:
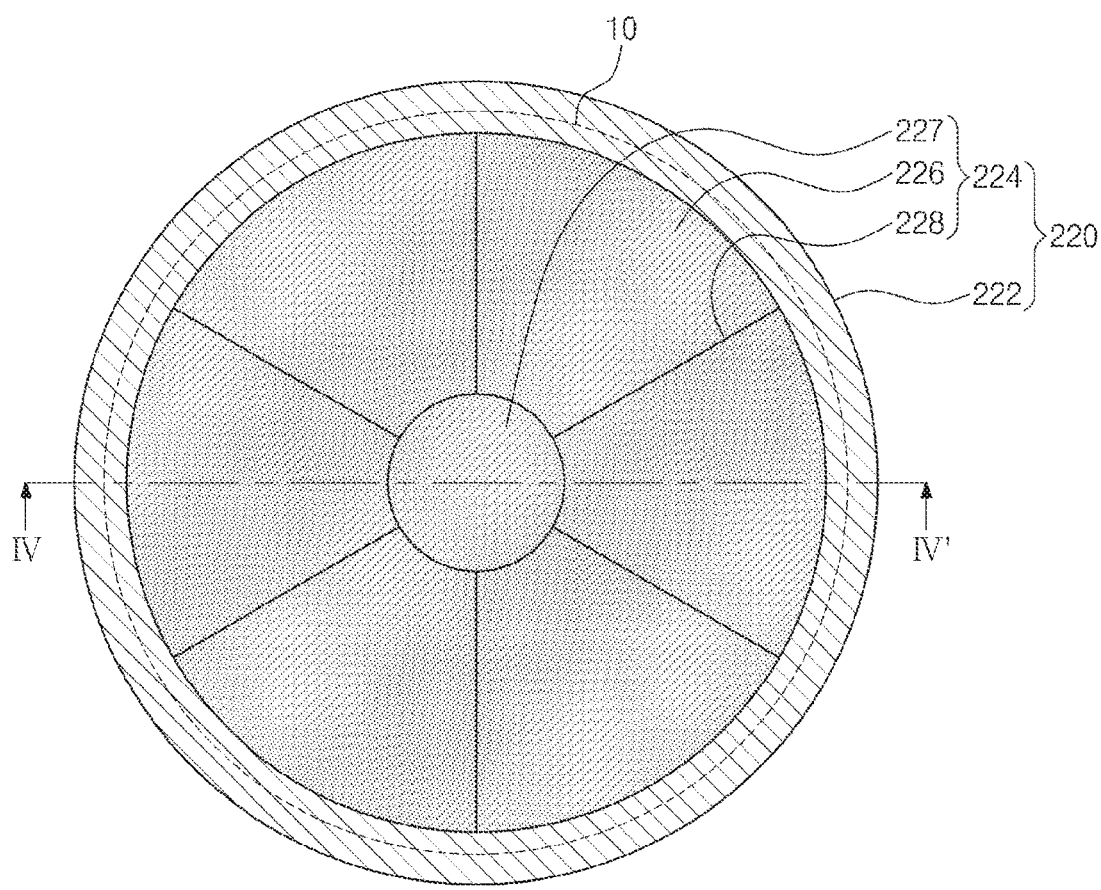
FIG. 11 is a plan view illustrating an example of a chuck disk of FIG. 6.
Figure 12:
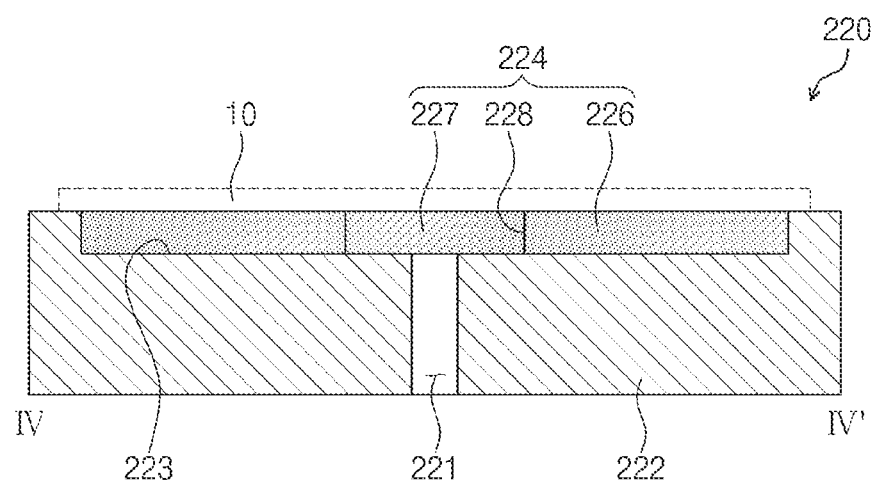
FIG. 12 is a sectional view taken along line IV-IV' of FIG. 11.

FIG. 11 is a plan view illustrating an example of the chuck disk 224 of FIG. 6. FIG. 12 is a sectional view taken along line IV-IV of FIG. 11. Referring to FIGS. 11 and 12, the chuck disk 224 may include a center disk 227. The base disk 222 may be configured to have substantially the same features as that described with reference to FIGS. 6 and 7.

The center disk 227 may be provided on a center region of the base disk 222. For example, the center disk 227 may be disposed on the base vacuum hole 221. In certain embodiments, the center disk 227 may be disposed on a center of a circle enclosing the chuck sectors 226. The chuck sectors 226 may be disposed to enclose the center disk 227. The center disk 227 may be formed of or include a porous ceramic material. The chuck connection member 228 may connect the chuck sectors 226 to the center disk 227. The chuck connection member 228 may also be used to fasten the chuck sectors 226 and the center disk 227 to the base recess 223 of the base disk 222. The center disk 227 may have a diameter ranging from about 5 cm to about 20 cm. If the center disk 227 is damaged, the center disk 227 may be replaced with a new or repaired one. Also, in the case where one of the chuck sectors 226 is damaged, the damaged chuck sector 226 may be individually replaced.

Figure 13:
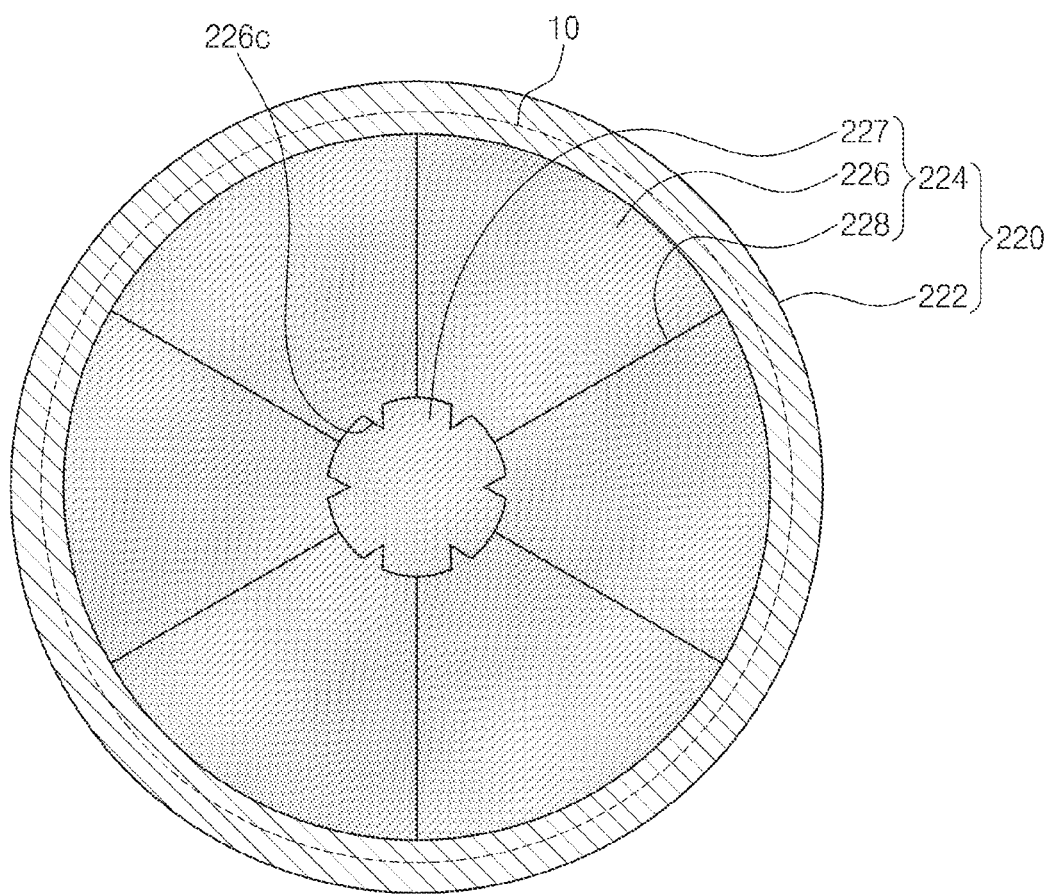
FIG. 13 is a plan view illustrating an example of a chuck disk of FIG. 11.

FIG. 13 is a plan view illustrating an example of the chuck disk 224 of FIG. 11. Referring to FIG. 13, the center disk 227 of the chuck disk 224 may have an alignment key 226c. The base disk 222 may be configured to have substantially the same features as that described with reference to FIGS. 6 and 7.

The alignment key 226c may be provided on a circumference surface of the center disk 227. In some embodiments, the alignment key 226c may include at least one concave alignment pattern. In certain embodiments, the alignment key 226c may include an alignment tip. Other embodiments of an alignment key may be utilized that interlock with the chuck sectors 226. The alignment key 226c may make it possible to allow the chuck sectors 226 to be aligned to the center disk 227 during the replacement of the chuck sectors 226.

According to exemplary embodiments of the inventive concept, a chuck table may include a plurality of sectors and a connection member connecting the sectors to each other. This may make it possible to individually replace a damaged sector with a new or repaired one. That is, it is possible to partially repair the chuck table. Such modular repair is also helpful when a chuck sector 226 becomes worn. Cost for the individual replacement of the sectors may be less than the cost required to replace all the sectors of the chuck table. Accordingly, it is possible to increase productivity of the chuck table. While exemplary embodiments of the inventive concepts have been particularly shown and described, it will be understood by one of ordinary skill in the art that variations in form and detail may be made therein without departing from the spirit and scope of the attached claims.

Any methods disclosed herein comprise one or more steps or actions for performing the described method. The method steps and/or actions may be interchanged with one another. In other words, unless a specific order of steps or actions is required for proper operation of the embodiment, the order and/or use of specific steps and/or actions may be modified.

References to approximations are made throughout this specification, such as by use of the terms "about" or "approximately." For each such reference, it is to be understood that, in some embodiments, the value, feature, or characteristic may be specified without approximation. For example, where qualifiers such as "about," "substantially," and "generally" are used, these terms include within their scope the qualified words in the absence of their qualifiers.

Reference throughout this specification to "an embodiment" or "the embodiment" means that a particular feature, structure or characteristic described in connection with that embodiment is included in at least one embodiment. Thus, the quoted phrases, or variations thereof, as recited throughout this specification are not necessarily all referring to the same embodiment.

Similarly, it should be appreciated that in the above description of embodiments, various features are sometimes grouped together in a single embodiment, figure, or description thereof for the purpose of streamlining the disclosure. This method of disclosure, however, is not to be interpreted as reflecting an intention that any claim require more features than those expressly recited in that claim. Rather, as the following claims reflect, inventive aspects lie in a combination of fewer than all features of any single foregoing disclosed embodiment.

The claims following this written disclosure are hereby expressly incorporated into the present written disclosure, with each claim standing on its own as a separate embodiment. This disclosure includes all permutations of the independent claims with their dependent claims. Moreover, additional embodiments capable of derivation from the independent and dependent claims that follow are also expressly incorporated into the present written description. These additional embodiments are determined by replacing the dependency of a given dependent claim with the phrase "any of the preceding claims up to and including claim [x]," where the bracketed term "[x]" is replaced with the number of the most recently recited independent claim. For example, for the first claim set that begins with independent claim 1, claim 3 may depend from either of claims 1 and 2, with these separate dependencies yielding two distinct embodiments; claim 4 may depend from any one of claim 1, 2, or 3, with these separate dependencies yielding three distinct embodiments; claim 5 may depend from any one of claim 1, 2, 3, or 4, with these separate dependencies yielding four distinct embodiments; and so on.

Recitation in the claims of the term "first" with respect to a feature or element does not necessarily imply the existence of a second or additional such feature or element. Elements specifically recited in means-plus-function format, if any, are intended to be construed in accordance with 35 U.S.C. § 112¶16. Embodiments of the invention in which an exclusive property or privilege is claimed are defined as follows.

The invention claimed is:

1. A chuck table, comprising:
   a base disk having a first vacuum hole; and
   a chuck disk disposed on the first vacuum hole,
   wherein the chuck disk comprises:
      a plurality of first circular sectors, wherein each of the plurality of circular first sectors is disposed on a different portion of the first vacuum hole and has a vertex on the first vacuum hole; and
      a first connection member connecting the first sectors to each other.

2. The chuck table of claim 1, wherein the first sectors contain a porous ceramic material.

3. The chuck table of claim 1, wherein the base disk has a base recess receiving the first sectors to be disposed therein.

4. The chuck table of claim 3, wherein the base disk comprises:
   a plurality of second sectors aligned to the first sectors; and
   a second connection member connecting the second sectors to each other.

5. The chuck table of claim 4, wherein the second connection member connects the second sectors to the first sectors.

6. The chuck table of claim 4, wherein the first connection member contains a ceramic adhesive material having a thermo-plastic property, and
   the second connection member contains a ceramic adhesive material having a thermosetting property.

7. The chuck table of claim 4, wherein the base disk further comprises a guard ring disposed on edges of the second sectors, the guard ring enclosing the first sectors.

8. The chuck table of claim 4, wherein the base disk further comprises a bottom disk disposed below the second sectors.

9. The chuck table of claim 8, wherein the bottom disk has a second vacuum hole aligned to the first vacuum hole.

10. The chuck table of claim 1, wherein the chuck disk further comprises a center disk disposed on a center of a circle enclosing the first sectors.

11. The chuck table of claim 10, wherein the center disk comprises at least one alignment key for alignment of the first sectors.

12. A chuck table, comprising:
    a base disk having a first vacuum hole and a base recess, wherein the first vacuum hole is located at a center of the base disk; and
    a chuck disk disposed in the base recess on the first vacuum hole,
    wherein the chuck disk comprises:
       a plurality of first circular sectors, wherein each of the plurality of first sectors is disposed on a different portion of the first vacuum hole and has a vertex on the first vacuum hole; and
       a first connection member connecting the first sectors to each other, and
    wherein the first vacuum hole acts as an air-flow pathway to allow a substrate to be fastened to the chuck disk using vacuum pressure.

13. The chuck table of claim 12, wherein the base disk comprises:
    a plurality of second sectors aligned to the first sectors; and a second connection member connecting the second sectors to each other.

14. The chuck table of claim 13, wherein the base disk further comprises a guard ring disposed on edges of the second sectors, the guard ring enclosing the first sectors.

15. The chuck table of claim 13, wherein the base disk further comprises a bottom disk disposed below the second sectors.

16. The chuck table of claim 12, wherein the chuck disk further comprises a center disk disposed on a center of a circle enclosing the first sectors.

17. A substrate processing system, comprising:
an index stage;
chuck tables disposed on the index stage to fasten a substrate; and
a polishing module disposed on the index stage to polish the substrate,
wherein each of the chuck tables comprises
a base disk with a vacuum hole and a chuck disk disposed on the vacuum hole, and
the chuck disk comprises a plurality of first sectors and a first connection member connecting the first sectors to each other, and
wherein each of the plurality of first circular sectors is disposed on a different portion of the first vacuum hole and has a vertex on the first vacuum hole.

18. The substrate processing system of claim 17, wherein the polishing module comprises:
a head;
a plurality of spindles connected to the head; and
grinding wheels, wherein each grinding wheel is disposable between one of the spindles and one of the chuck tables,
wherein the grinding wheels are configured to grind the first sectors.

19. The substrate processing system of claim 18, wherein the polishing module further comprises a polishing pad, wherein the polishing pad is disposable between one of the spindles and one of the chuck tables, and wherein the polishing pad is configured to polish the first sector.

20. The substrate processing system of claim 19, further comprising a slurry supplying nozzle configured to supply slurry in a region between the polishing pad and the substrate, and wherein the slurry supplying nozzle supplies the slurry on the first sectors.

* * * * *